(12) United States Patent
Willard (10) Patent No.: US 6,784,675 B2
(45) Date of Patent: Aug. 31, 2004

(54) WIRELESS TEST FIXTURE ADAPTER FOR PRINTED CIRCUIT ASSEMBLY TESTER

(75) Inventor: Stephen Willard, Fort Collins, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/179,625

(22) Filed: Jun. 25, 2002

(65) Prior Publication Data

US 2003/0234656 A1 Dec. 25, 2003

(51) Int. Cl.$^7$ .............................................. G01R 31/02
(52) U.S. Cl. ...................................... 324/754; 324/758
(58) Field of Search ................................ 324/754, 755, 324/758, 761, 158.1

(56) References Cited

U.S. PATENT DOCUMENTS

| | | | |
|---|---|---|---|
| 4,230,985 A | 10/1980 | Matrone et al. | 324/158 |
| 4,321,533 A | 3/1982 | Matrone | 324/158 |
| 4,535,536 A | 8/1985 | Wyss | 29/845 |
| 4,724,383 A | 2/1988 | Hart | 324/158 |
| 4,771,234 A | 9/1988 | Cook et al. | 324/158 |
| 4,774,459 A | 9/1988 | Maelzer et al. | 324/158 |
| 4,774,462 A | 9/1988 | Black | 324/158 |
| 4,799,007 A | 1/1989 | Cook et al. | 324/158 |
| 4,818,933 A | 4/1989 | Kerschner et al. | 324/158 |
| 4,884,024 A | 11/1989 | DiPerna | 324/158 |
| 4,935,696 A | 6/1990 | DiPerna | 324/158 |
| 4,977,370 A | 12/1990 | Andrews | 324/158 |
| 5,450,017 A | 9/1995 | Swart | 324/754 |
| 5,485,096 A | 1/1996 | Aksu | 324/761 |
| 5,493,230 A | 2/1996 | Swart et al. | 324/754 |
| 5,506,510 A | 4/1996 | Blumenau | 324/754 |
| 5,510,722 A | 4/1996 | Seavey | 324/758 |
| 5,663,655 A | 9/1997 | Johnston et al. | 324/761 |
| 5,773,988 A | 6/1998 | Sayre et al. | 324/761 |
| 5,818,248 A | 10/1998 | St. Onge | 324/761 |
| 5,945,836 A | 8/1999 | Sayre et al. | 324/761 |
| 6,025,729 A | * 2/2000 | Van Loan et al. | 324/754 |
| 6,047,469 A | * 4/2000 | Luna | 324/754 |
| 6,066,957 A | * 5/2000 | Van Loan et al. | 324/754 |
| 6,208,158 B1 | * 3/2001 | Schein et al. | 324/761 |
| 6,225,817 B1 | 5/2001 | Sayre et al. | 324/754 |
| 6,326,799 B1 | * 12/2001 | Schein | 324/754 |
| 2003/0016039 A1 | * 1/2003 | Williams et al. | 324/755 |

FOREIGN PATENT DOCUMENTS

| | | | |
|---|---|---|---|
| DE | 3143768 | 5/1983 | G01R/31/28 |
| DE | 19507127 | 9/1996 | G01R/31/28 |
| EP | 0135384 A | 3/1985 | G01R/1/073 |
| EP | 0650065 | 4/1995 | G01R/1/073 |
| FR | 2524649 | 10/1983 | G01R/31/28 |
| WO | WO9535648 | 12/1995 | G01R/1/073 |

OTHER PUBLICATIONS

QA Technology Company, Inc., Marketing Brochure, Copyright 1994.
Reducing Fixture–Induced Test Failures—Application Note 340–1, Hewlett–Packard Company dated Dec. 1990.
HP 3070 Family Test Fixture Product Catalog—Hewlett–Packard Company, copyright 1994.

* cited by examiner

Primary Examiner—Kamand Cuneo
Assistant Examiner—Jermele Hollington (57) ABSTRACT

A test fixture adapter for a printed circuit assembly tester is presented. The test fixture adapter implements the universal portions of the tester-to-fixture interface and allows mounting of a customized fixture interface printed circuit board thereon. The fixture interface printed circuit board and the fixture itself are completely separate. The adapter may be reused from one board design to the next, requiring only that a customized fixture interface printed circuit board and a customized fixture be redesigned and manufactured.

20 Claims, 4 Drawing Sheets

WIRELESS TEST FIXTURE ADAPTER FOR PRINTED CIRCUIT ASSEMBLY TESTER

FIELD OF THE INVENTION

The present invention pertains generally to testing of printed circuit assemblies, and more particularly to a low-cost wireless test fixture adapter for a printed circuit assembly tester.

BACKGROUND OF THE INVENTION

Printed circuit assemblies (PCA's) must be tested after manufacture. PCA testing may be categorized into bare-board testing and loaded-board testing. During bare-board testing, a bare printed circuit board without components and devices attached is tested to verify the continuity of the traces between pads and/or vias on the board. During loaded-board testing, a printed circuit board with some or all of the electrical components and devices attached is tested in order to verify that all required electrical connections have been properly completed. Loaded-board testing may also include integrated circuit (IC) testing, which is performed to verify that the loaded components perform within specification.

In previous years, PCA's were designed and manufactured so that their electrical contacts which were probed during test were arranged in a regularly spaced pattern. During testing, the PCA was placed directly atop a regularly spaced pattern of interface probes located in the tester. As PCA and component geometries shrunk, PCA contact pads could no longer be placed in a regularly spaced pattern and probed directly by interface probes. A bare-board fixture was developed which utilized long, leaning solid probes to provide electrical connections between small, closely spaced, randomly located targets on the PCB and regularly spaced interface probes located in the tester.

A bare-board tester probes testpads, vias, and plated through-holes on bare printed circuit boards only and tests for electrical connectivity and continuity between various test points in the circuits on the printed circuit boards before any components are mounted on the board. A typical bare-board tester contains test electronics with a large number of switches that connect test probes to corresponding test circuits in the electronic test analyzer.

Figure 1:
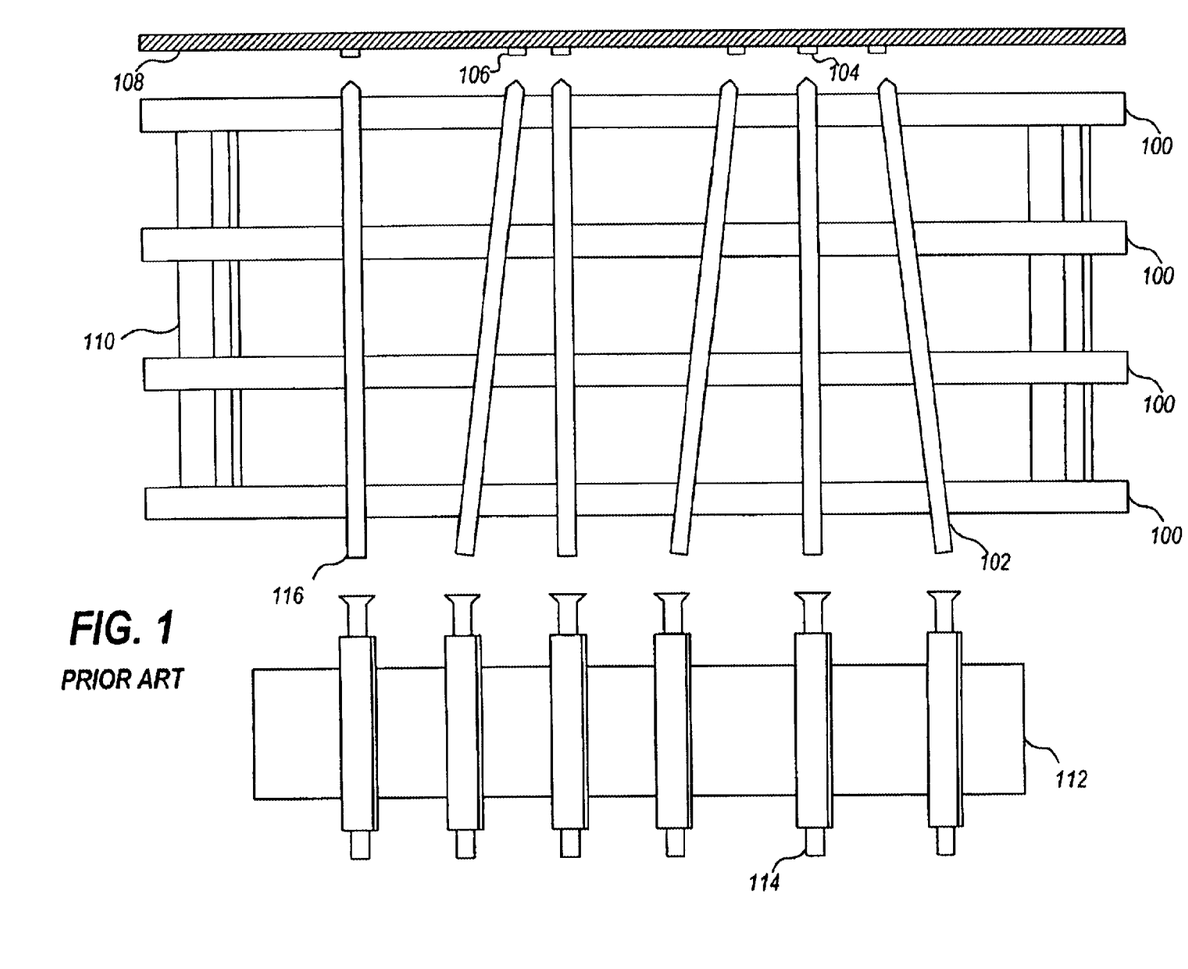
FIG. 1 shows a cut-away view of a first and second embodiment of a conventional bare-board translator test fixture.

Although each bare-board fixture builder uses unique components and manufacturing processes, most bare-board fixtures resemble that shown in FIG. 1 and include regularly spaced spring probes 114 on a testbed 112 of a tester and long, solid test probes 102 and 116 inserted through several layers of guide plates 100 drilled with small through-holes and held in a spaced-apart fashion with spacers 110. The bed of standard spring probes 114 actuate the solid test probes 102 and 116. The long, solid probes may be inserted into the guide plates vertically or at an angle in order to facilitate an easy transition between the fine-pitch, or very close, spacing of testpads 104 and 106 on the PCB side of the fixture and the larger-pitch spacing of the spring probes on the tester side of the fixture. One such bare-board fixture is disclosed in U.S. Pat. No. 5,493,230 titled "Retention of Test Probes in Translator Fixtures" to Swart et al., which is incorporated herein for all that it teaches.

Existing bare-board fixtures can consistently hit test targets equal to or greater than 20 mils in diameter with equal to or greater than 20-mil pitch (center-to-center spacing). Unfortunately, heretofore, it is not been possible to use bare-board fixtures directly on a loaded-board tester because there are many unique features which render bare-board test equipment directly incompatible with loaded-board test equipment.

Prior art bare-board fixtures are not designed to accommodate printed circuit boards (PCBs) which are populated with electronic components; only PCB features which are flush with respect to the PCB (pads, vias, and plated through holes) can be probed. Bare-board testers are used to determine the connectivity and continuity of test points and circuitry in a PCB. Unlike bare-board testers, loaded-board testers cannot tolerate higher electrical resistance between a target on a PCB and the tester electronics. Loaded-board fixtures must provide low-resistance connections and interfaces between targets, fixture components, and tester electronics. Unlike loaded-board testers, bare-board testers cannot determine whether a component or a group of components exists and functions properly.

The probe spacing of bare-board fixtures which are designed to fit on bare-board testers is not generally compatible with the interface probe spacing of loaded-board testers. Bare-board fixtures translate a target on the PCA under test to the nearest interface probe in the bare-board tester. However, loaded-board tester resources must be uniquely assigned and linked to specific targets and circuits. In loaded-board testing, the nearest interface probe may not be appropriate for a given target. Bare-board fixtures are not able to provide unique electrical routing to adjacent, nonadjacent, and remote tester resources, cannot reach remote resources, and cannot provide the complex, loaded-board resource routing patterns required by a loaded printed circuit board.

Figure 2:
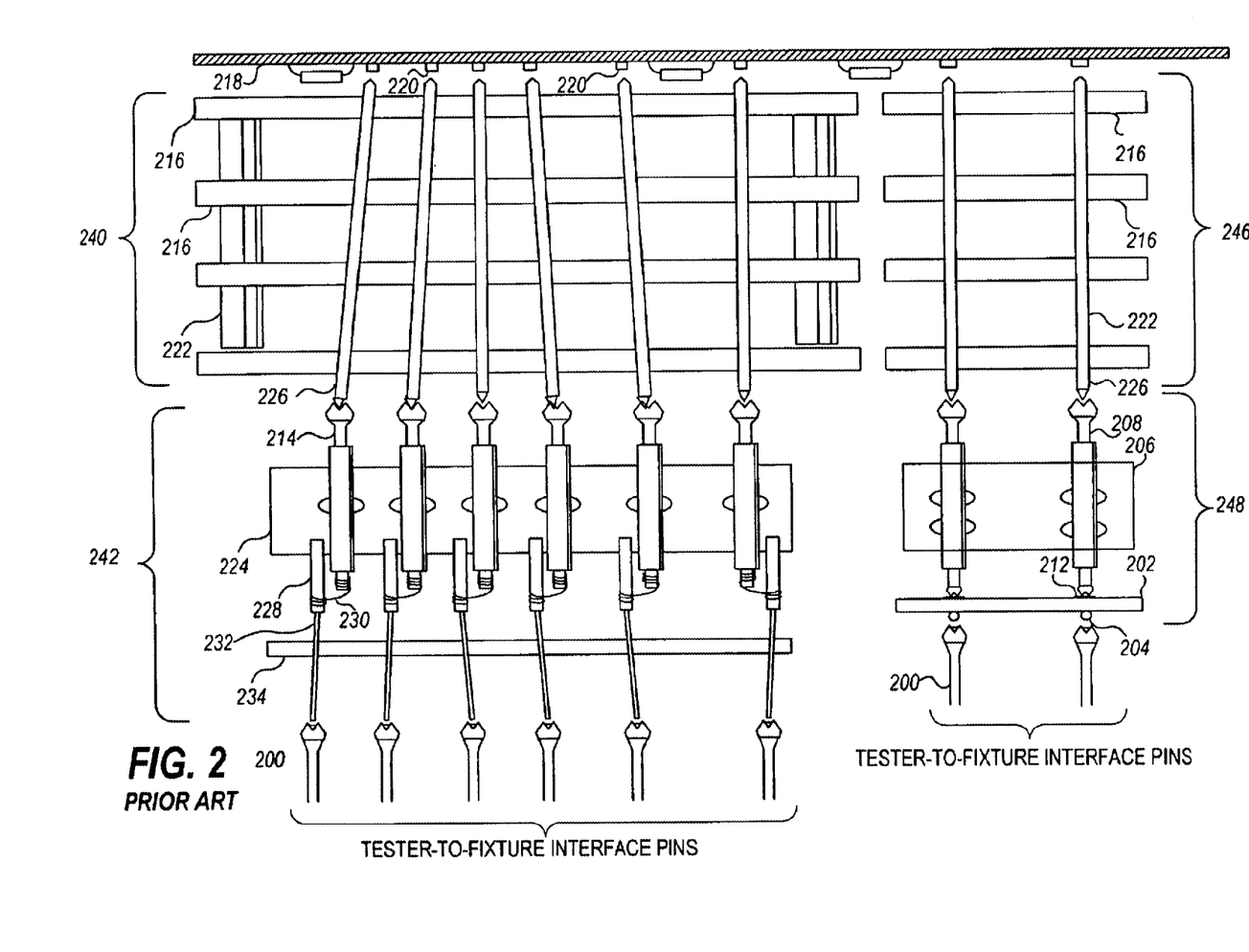
FIG. 2 shows a cut-away view of a prior art loaded-board, guided-probe test fixture.

FIG. 2 illustrates a first and second embodiment of a prior art loaded-board, guided-probe test fixture. The test fixture of the first embodiment comprises two major assemblies. The first assembly 240 is a translator fixture comprising a series of vertically spaced-apart and parallel guide plates 216, which are supported in parallel by solid posts 222 that hold the fixture together as a solid unit. The fixture also includes an array of leaning probes 226 extending through guide holes in the translator guide plates 216. The leaning probes 226 are in alignment on a first side of the translator fixture 240 with test targets 220 of a loaded circuit board 218. The leaning probes 226 are in alignment on a second side of the translator fixture 240 with spring probes 214 on a first side of a probe-mounting plate 224. The long leaning probes 226 are used to facilitate an easy transition from the fine-pitch targets 220 on the device under test 218 and larger pitch targets (spring probes 214) on the probe-mounting plate 224.

Probe-mounting plates are well known in the art; one such plate being a probe-mounting plate made of glass-reinforced epoxy. Personality pins 228 are embedded on a second side of the probe-mounting plate 224 and the personality pins are electrically connected to the spring probes 214 by wires 230. The wirewrap posts 232 of the personality pins 228 pass through holes in an alignment plate 234 to make contact with tester-to-fixture interface probes 200 which interface the fixture to the pins of the testhead (not shown). Tester-to-fixture interface probes 200 are in a predetermined fixed, regularly spaced pattern and are arranged to electrically contact the test pins of the testhead at one end. The alignment plate 234 aligns the wirewrap posts 232 of personality pins 228 to correspond to the predetermined location of the tester-to-fixture interface probes 200. The second major assembly 242 of the first embodiment is the unit of the probe-mounting plate 224 containing spring probes 214 and personality pins 228 and the alignment plate 234 which aligns the wirewrap posts 232 of the personality pins 228 with the tester-to-fixture interface probes 200.

Accurate alignment of the test fixture is essential for reliable operation. Alignment for the printed circuit board 218 to the translator fixture 240 is maintained by means of tooling pins (not shown), which is well known in the art of board test. Alignment between the translator fixture 240 and the probe-mounting plate 224 is maintained by means of alignment pins (not shown) or other known means. Alignment between the alignment plate 234 and the tester-to-fixture interface probes 200 is controlled through the mounting and locking hardware well known in the art of loaded-board test.

The method of operation of the test fixture is as follows. The translator assembly 240 is mounted on the probe-mounting plate/alignment plate assembly 242. The entire fixture, which includes the translator fixture 240 and the probe-mounting plate/alignment plate assembly 242 is then mounted on the regularly spaced tester-to-fixture interface probes 200. Next the loaded printed circuit board 218 to be tested is placed on the translator fixture assembly 240 by means of tooling pins (not shown). The test targets 220 of the loaded-printed circuit board 218 are then brought into contact with the leaning probes 226 of the translator fixture assembly 240 by any of several known means, including vacuum, pneumatic or mechanical actuating means. As the printed circuit board 218 is drawn toward the tester (not shown), the leaning probes 226 are sandwiched between the test targets 220 of the printed circuit board 218 and the spring probes 214, thus making a good, low-resistance contact between the tips of leaning probes 226 and test targets 220. The spring force of the spring probes 214 helps the tips of leaning probes 226 make a good contact with the test sites 220. Once electrical contact between the loaded printed circuit board and the leaning probes 226 is established, in-circuit or functional testing may commence.

As illustrated, the unit 242 which includes the probe-mounting plate 224, spring probes 214, personality pins 228, alignment plate 234, and wirewrap posts 232 is complicated and time consuming to build. Advances in fixture technology has led to what are known as "wireless" fixtures. The test fixture of the second embodiment shown in FIG. 2 illustrates the features of a wireless fixture. As illustrated, the wireless fixture comprises two major assemblies. The first assembly 246 is a translator fixture comprising a series of vertically spaced-apart and parallel guide plates 216, which are supported in parallel by solid posts 222 that hold the fixture together as a solid unit. The fixture 246 also includes an array of translator pins such as leaning probes 226 extending through guide holes in the translator plates 216. The leaning probes 226 are in alignment on a first side of the translator fixture with test targets 220 on printed circuit board 218. The leaning probes 226 are in alignment on a second side of the translator fixture 246 with double-headed spring probes 208 on a first side of a probe-mounting plate 206.

Double-headed spring probes 208 extend through a second side of the probe-mounting plate 206 and make electrical contact with contact pads 212 on a wireless interface printed circuit board (WIPCB) 202. The contact pads 212 on the first side of the PCB 202 are electrically connected to contact targets 204 on a second side of the PCB 202. Contact targets 204 on the second side of the wireless interface PCB 202 are patterned to correspond with tester-to-fixture interface probes 200 which interface the test pins of the testhead to the fixture. Tester-to-fixture interface probes 200 of the tester are in a predetermined fixed, regularly spaced pattern.

The wireless interface PCB 202 allows the double-sided spring probes 208 to correspond to predetermined locations of the tester-to-fixture interface probes 200 by means of copper traces from the contact pads 212 that correspond to the locations of the double-headed spring probes 208 to contact pads 204 that correspond to the locations of the tester-to-fixture interface probes 200 of the tester. The second major assembly 248 of the second embodiment is the unit of the probe-mounting plate 206 containing double-sided spring probes 208 and the wireless interface PCB 202 which aligns the double-sided spring probes 208 with the tester-to-fixture interface probes 200.

Alignment for the printed circuit board 218 to the translator fixture 246 is maintained by means of tooling pins (not shown), which is well known in the art of board test. Alignment between the translator fixture 246 and the probe-mounting plate 206 is maintained by means of alignment pins (not shown) or other known means. Alignment between the probe-mounting plate 206 and the wireless interface PCB 202 is maintained by means or alignment pins (not shown) or by other known means. Alignment between the wireless, interface PCB 202 and the tester-to-fixture interface probes 200 is controlled through mounting and locking hardware well known in the art of loaded-board test.

The method of operation of the test fixture is as follows. The translator assembly 246 is mounted on the probe-mounting plate/interface PCB assembly 248. The entire fixture, which includes the translator assembly 246 and the probe-mounting plate/interface PCB assembly 248 is then mounted on the regularly spaced tester-to-fixture interface probes 200 on the tester. Next the loaded printed circuit board 218 to be tested is placed on the translator fixture assembly 246 by means of tooling pins (not shown). The test targets 220 of the loaded-printed circuit board 218 are then brought toward the tester by any of several known means, including vacuum, pneumatic or mechanical actuating means. As the printed circuit board 218 is drawn toward the tester, the leaning probes 226 are sandwiched between the test targets 220 of the printed circuit board 218 and the double-headed spring probes 208, thus making a good, low-resistance contact between the tips of leaning probes 226 and test targets 220. The spring force of the double-headed spring probes 208 helps the tips of leaning probes 226 make a good contact with the test sites 220.

As component and board geometries shrink and become denser, loaded-board testing becomes more difficult using standard fixtures, resulting in more reliance on wireless fixture interfaces. Current wireless test fixtures include a tester-to-fixture interface which interfaces between the testhead probes and the fixture, a PCA interface which interfaces between the board under test and the fixture, and a fixture interface printed circuit board interfacing the tester interface and board interface. The tester interface is typically universal in that it does not change from one design of a board under test to the next. In contrast, the board interface and fixture interface printed circuit board are customized for the specific design of the board under test.

In current designs, the fixture interface PCB is positioned below the probe plate that bears the load of the probes. This design is advantageous because the fixture interface PCB is protected from damage since it lies within the fixture. However, the design is also problematic due to the difficulty in accessing the fixture interface PCB. Furthermore, current fixture designs include each of the tester-to-fixture interface, fixture interface PCB, and fixture-to-PCA interface. Thus, within a single fixture, the tester-to-fixture interface, fixture interface PCB, and fixture-to-PCA interface are all intertwined. In other words, the universal and customized portions of the fixture are each interdependent on one another. Thus, each time a fixture is manufactured for a particular board design, the universal tester-to-fixture interface must also be replicated. This adds significant weight and cost to the fixture.

Accordingly, a need exists for a fixture design which separates the universal and customized portions from one another to allow the universal portions of the fixture, such as the tester-to-fixture interface, to be reused for each board design. A need also exists for better access to the fixture interface PCB. It would also be desirable to reduce the weight and cost of the fixture. It would also be desirable to use the same tester-to-fixture interface for both bare-board testing and loaded-board testing.

SUMMARY OF THE INVENTION

The present invention is a test fixture adapter which implements the universal portions of the fixture interface and allows mounting of a customized fixture interface printed circuit board thereon. According to the invention, the fixture interface PCB and the fixture-to-PCA-under-test interface are designed to be completely separate. The testhead-to-fixture interface lies below the customized parts and is intended to be universal. The adapter may be reused from one board design to the next, requiring only that the fixture interface printed circuit board and customized portions of the fixture be redesigned and manufactured. In particular, only a single fixture adapter containing a universal testhead-to-fixture interface need be designed and employed for use with all fixtures. Because only the customized portions of the fixture are implemented in the fixture, this results in reduced cost and weight to the fixture. In addition, because the fixture interface PCB is separately mounted on the adapter, simpler access to the fixture interface PCB is facilitated.

An additional advantage of the invention is that the universal testhead-to-fixture interface may be compatible with both bare-board and loaded-board testing. In particular, the invention allows simple coupling of probes that do not require sockets such as bare board fixtures.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel wireless test fixture adapter and fixture are described in detail hereinafter. Although the invention is described in terms of specific illustrative embodiments, it is to be understood that the embodiments described herein are by way of example only and that the scope of the invention is not intended to be limited thereby.

Figure 3:
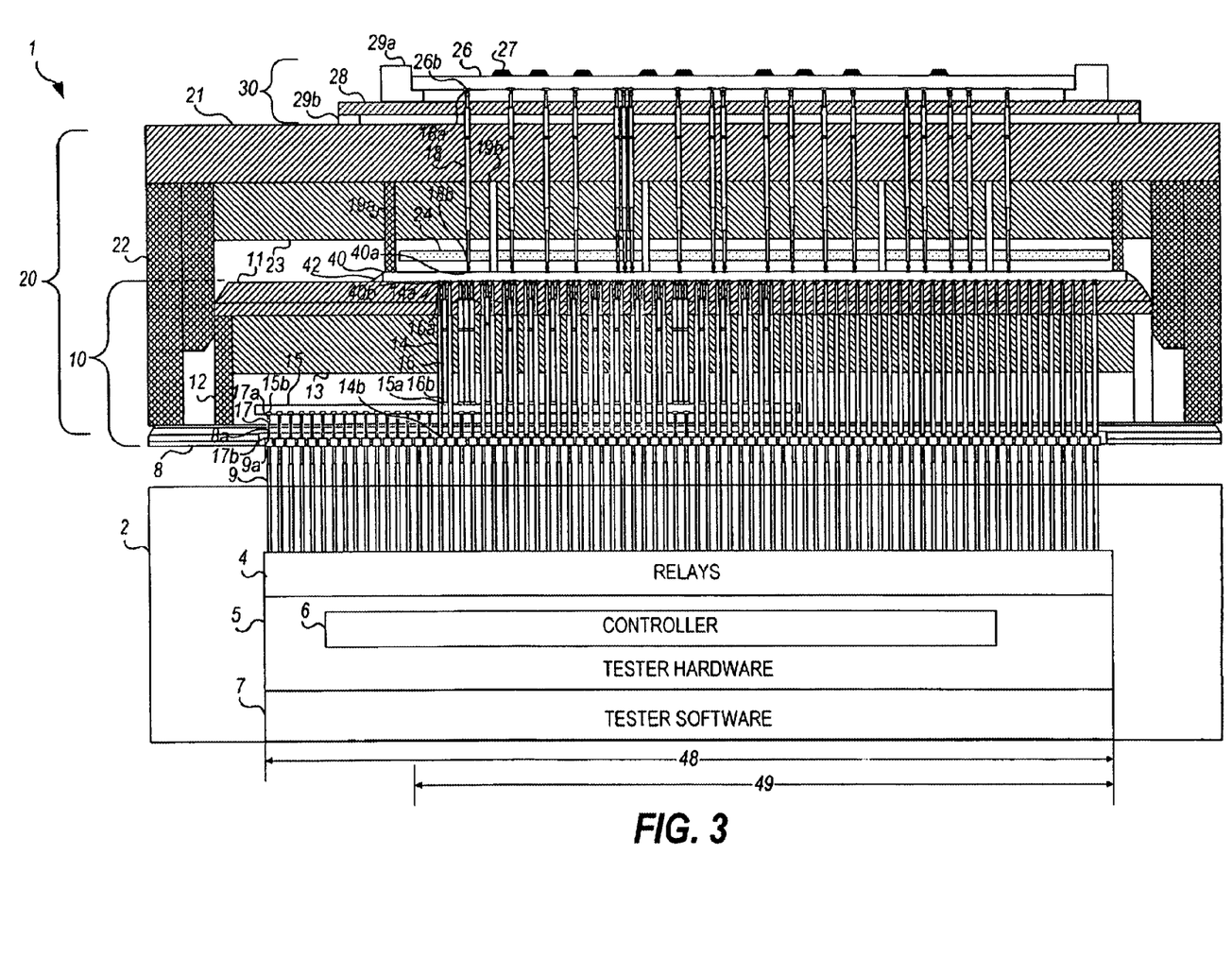
FIG. 3 is a cut-away view of a test system utilizing the fixture adapter of the invention and a loaded-board fixture.

Turning now to the invention, FIG. 3 illustrates a test system 1 utilizing the fixture adapter of the invention. Test system 1 includes a tester 2 with a fixture adapter 10, a fixture 20, and a printed circuit board mount 30 mounted thereon.

Tester 2 includes a plurality of test interface pins 9 arranged in a predetermined pattern (e.g., a rectangular array) just below the top plate 8 of the tester 2. The top plate 8 of the tester 2 is configured with access holes 8a to allow fixture pins and/or probes to access and contact test interface contact points 9a (e.g., the top conductive pads) of the test interface pins 9.

Tester 2 includes tester hardware 5 including test measurement and/or functional test circuitry which operates under the control of a controller 6. Controller 6 may be controlled by tester software 7, which may execute within the tester 2 itself, or may execute remotely on a remote computer and communicate with the tester via a standard communication interface. One function of the controller 6 is to configure the hardware 5 to make or to not make electrical connections between measurement and/or functional test circuits within the tester and each of the test interface pins 9. To this end, each test interface pin 9 is connectable to or isolated from the tester hardware by a respective relay 4. Electrical contact may be made with a respective test interface pin 9 by closing the relay; conversely, the pin 9 may be isolated from the test hardware by opening the relay 4.

Mountable on top of the tester and over the tester interface pin 9 field is the test fixture adapter 10 of the invention. The fixture adapter 10 comprises the universal interface components of the tester-to-PCA-under-test interface. In particular, in the illustrative embodiment, the fixture adapter 10 includes an adapter top plate 11 and an adapter guide plate 13 which together are supported by sidewalls 12. Adapter 10 includes a plurality of probes 14 that are inserted through precisely aligned holes in the guide/plate 13 and top plate 11. Probes 14 may be spring probes, which as known in the art, are standard devices, commonly used by the test community, which conduct electrical signals and contain a compression spring and plunger that move relative to the barrel and/or socket when actuated. Alternatively, probes 14 may be solid probes which also conduct electrical signals but have no additional parts which move relative to each other during actuation. Guide plate 13 ensures precise vertical alignment of the single-ended spring probes 14.

Optionally, as shown in the preferred embodiment of FIG. 3, the adapter 10 also includes a probe field shrinking printed circuit board (PCB) 15 which is used to translate a relatively larger test interface pin field 48 of the tester 2 to a relatively smaller probe field 49 of the printed circuit board under test 26. In particular, in this embodiment, the probe field shrinking PCB 15 comprises a plurality of pins 17 that connect at electrical contact points 17a on one end of the pins 17 to electrical contact points 9a on the top pads of certain test interface pins 9 of the tester 2 and on the other end to conductive contacts 15b on the probe field shrinking PCB 15 which route to conductive contacts 15a on the top side of the probe field shrinking PCB 15. The adapter 10 may include a plurality of probes (preferably floating single-ended spring probes) 16 configured with electrical contact points 10b on the bottom tips electrically contacting electrical contact points 15a of the probe field shrinking PCB 15. The floating single-ended spring probes 16 are also inserted through precisely aligned holes in the guide/plate 13 and top plate 11 such that electrical contact points 16a on the top tips 40a of the probes 16 electrically contact electrical contact points (e.g., pads) 40b on a fixture interface PCB 40 when a fixture interface PCB 40 is mounted in the adapter 10.

The adapter 10 includes a fixture interface printed circuit board (PCB) mount 42 mounted on the top plate 11 to allow a customized fixture interface PCB 40 to be securely mounted thereon. The fixture interface PCB mount 42 may be implemented with form-fitting guides (as shown), tooling pins, screws, or any other securing and alignment means.

In operation, the fixture adapter 10 is mounted over the tester 2, and in particular, over the test interface pin field 48 of the tester 2 such that electrical contact points (e.g. the bottom tips 14b) of the adapter probes 14 and electrical contact points (e.g., the bottom tips 17b) of the probe field shrinking PCB pins 17 extend through the access holes 8a of the top plate 8 of the tester to align with and make electrical contact with electrical contact points (e.g. the top pads 9a of corresponding test interface pins 9) of the tester 2, as shown.

The customized fixture interface PCB 40 is mounted in the fixture mount 42 such that electrical contact points (e.g. the top tips 14a) of the single-ended spring probes 14 and electrical contacts (e.g. the top tips 16a) of the floating single-ended spring probes 16 align with and make electrical contact with conductive pads 40b on the bottom side of the fixture interface PCB 40. The conductive pads 40b on the bottom side of the fixture interface PCB 40 electrically connect to conductive pads 40a on the top side of the fixture interface PCB 40 by traces and vias, and possibly through several intervening conductive layers of the PCB 40.

The fixture adapter 10 is intended to be universal such that it may be used over and over again with different fixtures 20 and fixture interface PCBs 40 customized for varying designs of boards under test 26.

The fixture 20 is implemented completely separate from the adapter 10 and fixture interface PCB 40 and is intended to include the customized interface between the fixture interface PCB and board under test 26. In the illustrative embodiment, the fixture 20 includes a top plate 21 and guide plate 23 supported by sidewalls 22, and an alignment plate 24. Fixture 20 includes a plurality of probes 18 (preferably double-ended spring probes) that are inserted through precisely aligned holes in the top plate 21, guide plate 23 and alignment plate 24. Plastic standoffs 19a and/or retainer screws 19b prevent the board under test from deflecting when the assembly is vacuum compressed during test of a PBC under test 28.

The fixture 20 includes a printed circuit board mount 30 mounted thereon. The printed circuit board mount 30 includes a support plate 28 mounted on the top side of the fixture top plate 21 by foam or spring gaskets 19b. Foam or spring gaskets 19a are also mounted on the top side of the support plate 28 to securely hold a PCB 26 therein. The printed circuit board 26 may be loaded, including one or more electrical components 27 attached thereto, or may be a bare board.

In operation, fixture 20 is mounted over the fixture adapter 10 (which has been fitted with a corresponding fixture interface PCB 40), precisely aligning the bottom tips 18b of the double-ended spring probes 18 onto conductive pads 40a on the top of the fixture interface PCB 40 to ensure electrical contact. A board under test 26 is mounted in the printed circuit board mount 30 such that the top tips 18a of the fixture probes 18 electrically contact respective conductive contacts 26b on the bottom side of the printed circuit board under test 26.

When a PCB 26 is to be tested, the PCB 26 is vacuum compressed such that the tester interface pins 9 press on and make electrical contact with the bottom tips 14b, 17b of the adapter probes/pins 14 and 17. The top tips 14a, 16a of the adapter probes 14 and 16 press on and make electrical contact with the fixture interface PCB 40 upward at its bottom conductive pads 40b. Simultaneously, the bottom tips 18b of the fixture probes 18 press against and make electrical contact with the fixture interface PCB 40 downward against its top conductive pads 40a. The top tips 18a of the fixture probes 18 press against and make electrical contact with the bottom conductive pads 26b of the PCB under test 26.

During test of the DUT 26, the test software 7 directs the controller 6 to configure the tester hardware 5 to make connections between certain tester interface pins 9 of interest to measurement or functional test circuits and/or signal generators within the tester hardware 5. The tester hardware 5 may then make measurements of the device or pad under test and/or generate test signals on the pins according to software instruction.

When a new board under test characterized by a different board design is to be tested, a customized fixture 20 and fixture interface PCB 40 must be redesigned and manufactured. The fixture adapter 10, however, may be reused with the new fixture 20 and fixture interface PCB 40. To this end, the new customized fixture interface PCB 40 is mounted in the fixture interface PCB mount 42 of the adapter 10, and the fixture aligned and mounted thereover as discussed above. Although a new fixture interface PCB 40 and fixture 20 must be customized and manufactured for each different board design, the universal interface components implemented in the adapter 10 remain the same. Accordingly, the universal interface components may be reused from one design to the next, thereby affording significant savings in cost, manufacturing and accessibility complexity, and fixture weight. In addition, because the fixture interface PCB 40 and fixture 20 are implemented completely separately, and mounted separately onto the tester 2, access to the fixture interface PCB 40 is readily accessible without taking the fixture 20 itself apart.

Figure 4:
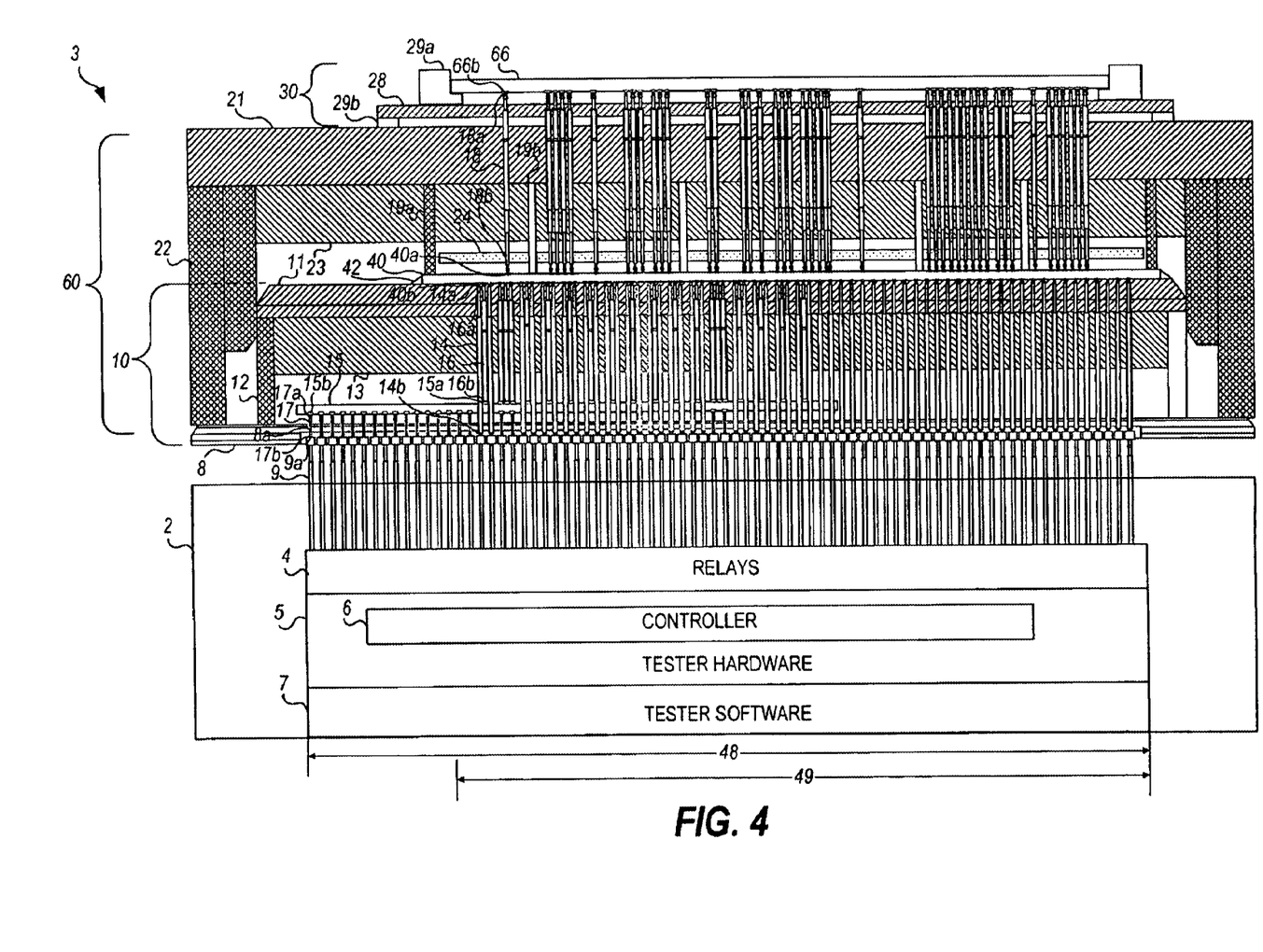
FIG. 4 is a cut-away view of a second embodiment of a test system utilizing the fixture adapter of the invention and a bare-board fixture.

FIG. 4 illustrates a test system 3 utilizing the fixture adapter 10 of the invention with a different bare-board fixture 60 that tests bare-board DUTs 66 of a particular bare-board OUT design. As illustrated, the components of the tester 2 and universal test fixture adapter 10 remain the same—only the customized fixture portions including the fixture interface PCB 80 and fixture probe assembly 20 are changed to conform to the DUT design of the bare-board DUT 66 under test. The components and functions of the components that make up the fixture interface PCB 80 and fixture probe assembly 20 remain the same (and hence are referenced using the same reference characters as in FIG. 3); however, the number and/or placement of the fixture interface conductive pads 40a and the number and/or placement of the fixture probes 18 are different in order to accommodate the number and placement of the DUT conductive test pads 66b of the bare-board DUT 66. Thus, it will be appreciated that the universal test fixture adapter 10 need not be redesigned and reimplemented, but may be used over and over again from one DUT design to the next. Furthermore, the universal test fixture adapter need not even be removed between fixture changes.

It will be appreciated that the fixture adapter of the invention may be implemented in various ways. However, the invention is intended to include any universal adapter design that includes one or more universal interface components and that arranges the PCB mount in a location that allows accessible mounting and swapping of fixture interface PCBs.

The above-described invention improves over the prior art in several ways. First, it separates the universal unchanging interface portions of the test fixture from the customize interface portions, allowing the universal unchanging interface portions of the test fixture to be reused over and over again. Second, it places the fixture interface printed circuit board on top of the universal unchanging interface portions of the test fixture, thereby providing easier access to the fixture interface printed circuit board and eliminating any interdependency between the universal and customized portions of the fixture.

An additional advantage of the invention is that the universal testhead-to-fixture interface may be compatible with both bare-board and loaded-board testing. In particular, the invention allows simple coupling of probes that do not require sockets such as bare board fixtures. This allows larger bare-board probes (e.g., having a tip diameter of 75 mils) to be spaced on smaller loaded-board probes (e.g., having 50 mil centers).

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A universal test fixture adapter for interfacing between a single printed circuit assembly tester and a plurality of different test fixtures, each of said plurality of different test fixtures customized to a different device under test (DUT) design having a different DUT conductive test pad configuration and each comprising a respective fixture interface printed circuit board (PCB) and a respective fixture probe assembly having a DUT mount for seating a DUT of said respective DUT design, each said respective fixture probe assembly comprising a plurality of first probe assembly electrical contact points accessible on a first side of said fixture probe assembly that are respectively conductively connected to a plurality of second probe assembly electrical contact points on a second side of said fixture probe assembly, and each said respective fixture interface PCB comprising a plurality of adapter interface conductive pads on a first side of said respective fixture interface PCB and a plurality of fixture interface conductive pads on a second side of said fixture interface PCB, said printed circuit assembly tester comprising a plurality of tester interface electrical contact points, said test fixture adapter comprising:

a plurality of first electrical contact points;
 a plurality of second electrical contact points;
 a plurality of adapter conductive paths each electrically connecting a respective first electrical contact point with a at least one respective second electrical contact point; and
 a fixture interface PCB mount configured to hold a respective fixture interface PCB of a respective one of said plurality different test fixtures;
 wherein any of said plurality of different test fixtures may be mounted on said universal test fixture adapter to test various DUTs corresponding to said DUT design of said mounted test fixture such that when a selected fixture interface PCB of a selected one of said plurality of different test fixtures that is customized to said DUT design of a selected DUT is mounted in said fixture interface PCB mount of said universal test fixture adapter, a selected fixture probe assembly corresponding to said selected one of said plurality of different test fixtures is mounted over said fixture interface PCB mount of said universal test fixture adapter, said selected DUT is mounted in said DUT mount of said selected fixture probe assembly, and a test of said selected DUT is actuated;
 at least one of said first electrical contact points of said universal test fixture adapter precisely aligns with and makes electrical contact with a respective at least one test interface electrical contact point of said printed circuit assembly tester,
 said second electrical contact points that are conductively connected to said at least one of said first electrical contact points via at least one of said plurality of conductive paths precisely align with and make electrical contact with a respective at least one of said plurality of adapter interface conductive pads on said first side of said fixture interface PCB,
 said fixture interface conductive pads on said second side of said fixture interface PCB that are conductively connected to said at least one of said respective adapter interface conductive pads precisely align with and make electrical contact with at least one respective first probe assembly electrical contact point, and said second probe assembly electrical contact points that are conductively connected to said at least one respective first probe assembly electrical contact point precisely align with and make electrical contact with respective at least one DUT conductive test pads.

2. A universal test fixture adapter in accordance with claim 1, wherein:
 said fixture interface PCB comprises a bare board having no electrical components attached thereon.

3. A universal test fixture adapter in accordance with claim 1, wherein:
 said fixture interface PCB comprises a loaded board having at least one electrical component attached thereon.

4. A universal test fixture adapter in accordance with claim 1, comprising:
 a tester probe field shrinking adapter comprising:
  a plurality of third electrical contact points;
  a plurality of fourth electrical contact points;
  a plurality of tester probe field shrinking adapter conductive paths each electrically connecting a respective third electrical contact point with a respective fourth electrical contact point;
  a plurality of fifth electrical contact points; and
 a plurality of conductive paths each electrically connecting a respective fourth electrical contact point with a respective fifth electrical contact point;
 wherein when said selected fixture interface PCB of said selected one of said plurality of different test fixtures is mounted in said fixture interface PCB mount of said universal test fixture adapter, said selected fixture probe assembly corresponding to said selected one of said plurality of different test fixtures is mounted over said fixture interface PCB mount of said test fixture, said selected DUT is mounted in said DUT mount of said selected fixture probe assembly, and said test of said selected DUT is actuated:
  respective at least one said plural of third electrical contact points precisely align with and make electrical contact with respective at least one of said plurality of test interface electrical contact points; and
  respective at least one of said plurality of fifth electrical contact points electrically connect with respective at least one of said plurality of second electrical contact points.

5. A universal test fixture adapter in accordance with claim 4, wherein:

said plurality of third electrical contact points are implemented on a first side of a tester probe field shrinking printed circuit board, said plurality of fourth electrical contact points and said plurality of fifth electrical contact points are implemented on a second side of said tester probe field shrinking printed circuit board, and said plurality of conductive paths connecting said respective third electrical contact points with said respective fourth electrical contact points are implemented by electrically conductive traces on said tester probe field shrinking printed circuit board, and said plurality of test probe field shrinking printed circuit board conductive paths connecting a said at least one respective fourth electrical contact points with a said at least one respective fifth electrical contact points are implemented with electrically conducting probes.

6. A universal test fixture adapter in accordance with claim 1, wherein:

at least one of said plurality of adapter conductive paths comprises an electrically conductive probe having a first tip implementing a first electrical contact point and a second tip implementing a second electrical contact point.

7. A universal test fixture adapter in accordance with claim 6, comprising:

a universal probe plate which guides and aligns said at least one electrically conductive probe such that said respective first tip precisely aligns with and makes electrical contact with said respective tester interface electrical contact point of said tester.

8. A universal test fixture adapter in accordance with claim 6, comprising:

a tester probe field shrinking adapter comprising:
  a plurality of third electrical contact points;
  a plurality of fourth electrical contact points;
  a plurality of tester probe field shrinking adapter conductive paths each electrically connecting a respective third electrical contact point with a respective fourth electrical contact point;
  a plurality of fifth electrical contact points; and
  a plurality of electrical connections conductive paths each electrically connecting a respective fourth electrical contact point with a respective fifth electrical contact point;

wherein when said selected fixture interface PCB of said selected one of said plurality of different test fixtures is mounted in said fixture interface PCB mount of said universal test fixture adapter, said selected fixture probe assembly corresponding to said selected one of said plurality of different test fixtures is mounted over said fixture interface PCB mount of said test fixture, said selected DUT is mounted in said DUT mount of said selected fixture probe assembly, and said test of said selected DUT is actuated:

respective at least one said plurality of third electrical contact points precisely align with and make electrical contact with respective at least one of said plurality of test interface electrical contact points; and
  respective at east one of said plurality of fifth electrical contact points electrically connect with respective at least one of said plurality of second electrical contact points.

9. A universal test fixture adapter in accordance with claim 8, wherein:

said plurality of third electrical contact points are implemented on a first side of a tester probe field shrinking printed circuit board, said plurality of fourth electrical contact points and said plurality of fifth electrical contact points are implemented on a second side of said tester probe field shrinking printed circuit board, and said plurality of conductive paths connecting said respective third electrical contact points with said respective fourth electrical contact points are implemented by electrically conductive traces on said tester probe field shrinking printed circuit board, and said plurality of test probe field shrinking printed circuit board conductive paths connecting a said at least one respective fourth electrical contact points with a said at least one respective fifth electrical contact points are implemented with electrically conducting probes.

10. A test system comprising:

a printed circuit assembly tester comprising a plurality of test interface electrical contact points arranged in a predetermined arrangement;

a universal test fixture adapter for interfacing between a single printed circuit assembly tester and a plurality of different test fixtures, each of said plurality of different test fixtures customized to a different device under test (DUT) design having a different DUT conductive test pad configuration and each comprising a respective fixture interface printed circuit board (PCB) and a respective fixture probe assembly having a DUT mount for seating a DUT of said respective DUT design, each said respective fixture probe assembly comprising a plurality of first probe assembly electrical contact points accessible on a first side of said fixture probe assembly that are respectively conductively connected to a plurality of second probe assembly electrical contact points on a second side of said fixture probe assembly, and each said respective fixture interface PCB comprising a plurality of adapter interface conductive pads on a first side of said respective fixture interface PCB and a plurality of fixture interface conductive pads on a second side of said fixture interface PCB, said printed circuit assembly tester comprising a plurality of tester interface electrical contact points, said universal test fixture adapter comprising:

a plurality of first electrical points;
  a plurality of second electrical contact points;
  a plurality of adapter conductive paths each electrically connecting a respective first electrical contact point with at least one respective second electrical contact point; and
  a fixture interface printed PCB mount configured to hold a respective one of any of said plurality of fixture interface PCBs corresponding to said plurality of different test fixtures to allow testing of various DUTs corresponding to a selected DUT design of a selected test fixture from among of said plurality different test fixtures;

a selected fixture interface PCB of a selected one of said plurality of different test fixtures that is customized to said DUT design of a selected DUT mounted in said fixture interface PCB mount of said universal test fixture adapter;

a selected fixture probe assembly corresponding to said selected one of said plurality of different test fixtures mounted over said fixture interface PCB mount of said test fixture;

a selected DUT mounted in said DUT mount of said selected fixture probe assembly;

wherein:

at least one of said first electrical contact points of said universal test fixture adapter precisely aligns with and makes electrical contact with a respective at least one test interface electrical contact point of said printed circuit assembly tester, said second electrical contact points that are conductively connected to said at least one of said first electrical contact points via at least one of said plurality of conductive paths precisely align with and make electrical contact with a respective at least one of said plurality of adapter interface conductive pads on said first side of said fixture interface PCB, said fixture interface conductive cads on said second side of said fixture interface PCB that are conductively connected to said at least one of said respective adapter interface conductive pads precisely align with and make electrical contact with at least one respective first probe assembly electrical contact point, and said second probe assembly electrical contact points that are conductively connected to said at least one respective first probe assembly electrical contact point precisely align with and make electrical contact with respective at least one DUT conductive test pads.

11. A test system in accordance with claim 10, wherein: said fixture interface PCB comprises a bare board having no electrical components attached thereon.

12. A test system in accordance with claim 10, wherein: said fixture interface PCB comprises a loaded board having at least one electrical components attached thereon.

13. A test system in accordance with claim 10, wherein said universal test fixture adapter further comprises:

a tester probe field shrinking adapter mounted between said tester and said universal test fixture adapter, said tester probe field shrinking adapter comprising:

a plurality of third electrical contact points;

a plurality of fourth electrical contact points;

a plurality of tester probe field shrinking adapter conductive paths each electrically connecting a respective third electrical contact point with a respective fourth electrical contact point;

a plurality of fifth electrical contact points; and a plurality of conductive paths each electrically connecting a respective fourth electrical contact point with a respective fifth electrical contact point;

wherein respective at least one said plurality of third electrical contact points precisely align with and make electrical contact with respective at least one of said plurality of test interface electrical contact points, and respective at least one of said plurality of fifth electrical contact points electrically connect with respective at least one of said plurality of second electrical contact points.

14. A test system in accordance with claim 13, wherein:

said plurality of third electrical contact points are implemented on a first side of a tester probe field shrinking printed circuit board, said plurality of fourth electrical contact points and said plurality of fifth electrical contact points are implemented on a second side of said tester probe field shrinking printed circuit board, and said plurality of conductive paths connecting said respective third electrical contact points with said respective fourth electrical contact points are implemented by electrically conductive traces on said tester probe field shrinking printed circuit board, and said plurality of test probe field shrinking printed circuit board conductive paths connection said at least one respective fourth electrical contact points with said at least one respective fifth electrical contact points are implemented with electrically conducting probes.

15. A test system in accordance with claim 10, wherein:

at least one of said plurality of adapter conductive paths comprises an electrically conductive probe having a first tip implementing a first electrical contact point and a second tip implementing a second electrical contact point.

16. A test system in accordance with claim 15, comprising:

a universal probe plate which guides and aligns said at least one electrically conductive probe such that said respective first tip precisely aligns with and makes electrical contact with said respective tester interface electrical contact point of said tester.

17. A test system in accordance with claim 15, comprising:

a tester probe field shrinking adapter mounted between said tester and said universal test fixture adapter, said tester probe field shrinking adapter comprising:

a plurality of third electrical contact points;

a plurality of fourth electrical contact points;

a plurality of tester probe field shrinking adapter conductive paths each electrically connecting a respective third electrical contact point with a respective fourth electrical contact point;

a plurality of fifth electrical contact points; and a plurality of conductive paths each electrically connecting a respective fourth electrical contact point with a respective fifth electrical contact point;

wherein respective at least one said plurality of third electrical contact points precisely align with and make electrical contact with respective at least one of said plurality of test interface electrical contact points, and respective at least one of said plurality of fifth electrical contact points electrically connect with respective at least one of said plurality of second electrical contact points.

18. A test system in accordance with claim 17, wherein:

said plurality of third electrical contact points are implemented on a first side of a tester probe field shrinking printed circuit board, said plurality of fourth electrical contact points and said plurality of fifth electrical contact points are implemented on a second side of said tester probe field shrinking printed circuit board, and said plurality of conductive paths connecting said respective third electrical contact points with said respective fourth electrical contact points are implemented by electrically conductive traces on said tester probe field shrinking printed circuit board, and said plurality of test probe field shrinking printed circuit board conductive paths connecting said at least one respective fourth electrical contact points with said at least one respective fifth electrical contact points are implemented with electrically conducting probes.

19. A method for interfacing a printed circuit assembly tester and a customized test fixture, said printed circuit assembly tester comprising a tester interface comprising a plurality of tester interface electrical contact points, said method comprising:

mounting a universal test fixture adapter comprising a plurality of first electrical contact points, a plurality of second electrical contact points, a plurality of adapter conductive paths each electrically connecting a respective first electrical contact point with at least one respective second electrical contact point, and a fixture interface PCB mount configured to hold a fixture interface PCB over said tester interface such that at least one of said first electrical contact points of said universal test fixture adapter precisely aligns with and makes electrical contact with a respective at least one test interface electrical contact point of said printed circuit assembly tester;

mounting a selected fixture interface PCB of a selected test fixture that is customized to allow testing of a DUT corresponding to a selected DUT design in said fixture interface PCB mount of said universal test fixture adapter such that said second electrical contact points of said universal test fixture adapter that are conductively connected to said at least one of said first electrical contact points via at least one of said plurality of conductive paths of said universal test fixture adapter precisely align with and make electrical contact with a respective at least one of a plurality of adapter interface conductive pads on a first side of said selected fixture interface PCB;

mounting a selected fixture probe assembly of said selected test fixture over said fixture interface PCB mount of said universal test fixture adapter such that respective at least one of said plurality of fixture interface conductive cads on said second side of said fixture interface PCB that are conductively connected to said at least one of said respective adapter interface conductive pads precisely align with and make electrical contact with respective at least one first probe assembly electrical contact points of said selected fixture probe assembly;

mounting a selected DUT corresponding to said selected DUT design in a DUT mount of said selected fixture probe assembly such that respective at least one of said plurality of second probe assembly electrical contact points that are conductively connected to said at least one respective first probe assembly electrical contact points precisely align with and make electrical contact with respective at least one DUT conductive test pads on said selected DUT.

20. A method in accordance with claim 19, comprising:

mounting a tester probe field shrinking adapter between said tester and said universal test fixture adapter, said tester probe field shrinking adapter comprising:
- a plurality of third electrical contact points;
- a plurality of fourth electrical contact points;
- a plurality of tester probe field shrinking adapter conductive paths each electrically connecting a respective third electrical contact point with a respective fourth electrical contact point;
- a plurality of fifth electrical contact points; and
- a plurality of conductive paths each electrically connecting a respective fourth electrical contact point with a respective fifth electrical contact point;

wherein respective at least one said plurality of third electrical contact points precisely align with and make electrical contact with respective at least one of said plurality of test interface electrical contact points, and respective at least one of said plurality of fifth electrical contact points electrically connect with respective at least one of said plurality of second electrical contact points.

* * * * *